United States Patent
Duncan et al.

(10) Patent No.: US 9,425,803 B1
(45) Date of Patent: Aug. 23, 2016

(54) APPARATUSES AND METHODS FOR IMPLEMENTING VARIOUS PHYSICALLY UNCLONABLE FUNCTION (PUF) AND RANDOM NUMBER GENERATOR CAPABILITIES

(71) Applicant: The United States of America as represented by the Secretary of the Navy, Washington, DC (US)

(72) Inventors: Adam Duncan, Bloomington, CA (US); Matthew Gadlage, Bloomington, CA (US); Austin Roach, Bloomfield, IN (US); Matthew Kay, Jasper, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/720,143

(22) Filed: May 22, 2015

Related U.S. Application Data

(60) Provisional application No. 62/158,150, filed on May 7, 2015.

(51) Int. Cl.
| | | |
|---|---|---|
| *H03K 19/00* | (2006.01) | |
| *H03K 19/177* | (2006.01) | |
| *G06F 12/14* | (2006.01) | |
| *G06F 12/16* | (2006.01) | |

(52) U.S. Cl.
CPC ......... *H03K 19/17768* (2013.01); *G06F 12/14* (2013.01); *G06F 12/1408* (2013.01); *G06F 12/1433* (2013.01); *G06F 12/1458* (2013.01); *G06F 12/16* (2013.01)

(58) Field of Classification Search
CPC ............. H04L 2209/12; H04L 9/3278; H04L 9/0866; H04L 9/34; G06F 21/73; G06F 11/2273; G06F 21/70; G06F 21/72; G06F 21/44; G06F 12/1408; G06F 17/5045; G06F 21/31; G06F 2212/1052; G06F 12/14; G06F 12/1425; G06F 12/1433; G06F 12/1458; G06F 12/16; H03K 19/003; H03K 19/17768; H01L 22/34; G01R 31/2889; G11C 16/22

See application file for complete search history.

(56) References Cited

U.S. PATENT DOCUMENTS

| | | | |
|---|---|---|---|
| 8,981,810 B1 * | 3/2015 | Trimberger | .......... H03K 19/003 326/15 |
| 9,018,972 B1 * | 4/2015 | Gurrieri | ............... H03K 19/003 326/8 |
| 9,046,573 B1 * | 6/2015 | Watt | ..................... G06F 17/5045 |
| 9,082,514 B1 * | 7/2015 | Trimberger | ............ G11C 29/06 |
| 2009/0083833 A1 * | 3/2009 | Ziola | ....................... G06F 21/31 726/2 |

(Continued)

*Primary Examiner* — Vibol Tan
(74) *Attorney, Agent, or Firm* — Christopher A. Monsey

(57) ABSTRACT

Methods and apparatuses for implementing a Physically Unclonable Function (PUF) and random number generator capabilities comprising providing a device under test comprising a plurality of bits comprising integrated circuits each including a capacitor; placing the bits in a first state with charge on selected bit capacitors; stopping bit refresh for a first predetermined time; re-enabling refresh for a second predetermined time to read and refresh charge on all bits; reading all bits and recording addresses of bits that have experienced bit flip from a first state to a second state comprising from "1" to "0" state; performing selecting a plurality of said recorded addresses to generate a PUF or cryptographic key; and performing an operation comprising a test or verification operation with said generated information PUF or key. Various hardware elements are also provided as well as machine readable instructions for implementing and controlling aspects of the invention.

11 Claims, 10 Drawing Sheets

(56) References Cited

U.S. PATENT DOCUMENTS

| | | | | |
|---|---|---|---|---|
| 2013/0147511 A1* | 6/2013 | Koeberl | H03K 19/23 | 326/8 |
| 2014/0093074 A1* | 4/2014 | Gotze | H04L 9/0866 | 380/45 |
| 2014/0126306 A1* | 5/2014 | Otterstedt | G11C 7/06 | 365/189.07 |
| 2014/0189890 A1* | 7/2014 | Koeberl | G06F 21/70 | 726/34 |
| 2014/0327469 A1* | 11/2014 | Pfeiffer | H03K 19/003 | 326/8 |
| 2015/0092939 A1* | 4/2015 | Gotze | H04L 9/34 | 380/2 |
| 2015/0195088 A1* | 7/2015 | Rostami | G09C 1/00 | 380/28 |
| 2015/0234751 A1* | 8/2015 | Van Der Sluis | G06F 12/1408 | 713/193 |
| 2015/0236693 A1* | 8/2015 | Pfeiffer | H03K 19/003 | 326/8 |
| 2015/0355886 A1* | 12/2015 | Peeters | G06F 7/588 | 705/250 |
| 2015/0370247 A1* | 12/2015 | Newell | G05B 19/41875 | 702/81 |

* cited by examiner

| Time | ADDR0 | ADDR1 | ADDR2 | ADDR3 | ADDR4 | ADDR5 | ADDR6 | ADDR7 | ... |
|---|---|---|---|---|---|---|---|---|---|
| T=T0 | 1 | 1 | 1 | 1 | 1 | 1 | 1 | 1 | ... |
| T=T1 | 1 | 0 | 1 | 1 | 0 | 1 | 1 | 0 | ... |
| T=T2 | 1 | 0 | 0 | 1 | 0 | 1 | 1 | 0 | ... |
| T=TN | 0 | 0 | 0 | 0 | 0 | 0 | 0 | 0 | 0 |

Fig. 4

| Time | ADDR0 | ADDR1 | ADDR2 | ADDR3 | ADDR4 | ADDR5 | ADDR6 | ADDR7 | ... |
|---|---|---|---|---|---|---|---|---|---|
| T=T0 | 1 | 1 | 1 | 1 | 1 | 1 | 1 | 1 | ... |
| T=T1_1 | 1 | 0 | 1 | 1 | 0 | 1 | 1 | 0 | ... |
| T=T1_2 | 1 | 0 | 0 | 1 | 0 | 1 | 1 | 0 | ... |
| T=T1_3 | 1 | 0 | 1 | 1 | 0 | 1 | 1 | 0 | ... |

301 — PUF Response Data Extraction/Key Creation/Storage Module

- Position device (e.g., DRAM)
- Couple device with test control station
- Execute machine readable instructions (e.g., some or all of Figs. 6-8 steps) to generate stored PUF response key data
- Record PUF response key data

303 — PUF Response Verification Module

- Position device
- Couple device with test control station
- Execute Machine readable instructions (e.g., some or all of Figs. 6-8 steps) to generate test PUF response key data
- Compare stored PUF response key data with test PUF response data from the device
- Determine a match or no match
- Match = verified
- No match = not verified
- Display or output match or no-match result

US 9,425,803 B1

APPARATUSES AND METHODS FOR IMPLEMENTING VARIOUS PHYSICALLY UNCLONABLE FUNCTION (PUF) AND RANDOM NUMBER GENERATOR CAPABILITIES

CROSS-REFERENCE TO RELATED APPLICATIONS

The present application claims priority to U.S. Provisional Patent Application Ser. No. 62/158,150, filed May 7, 2015, entitled "APPARATUSES AND METHODS FOR IMPLEMENTING VARIOUS PHYSICALLY UNCLONABLE FUNCTION (PUF) AND RANDOM NUMBER GENERATOR CAPABILITIES," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 200,236) is assigned to the United States Government and is available for licensing for commercial purposes. Licensing and technical inquiries may be directed to the Technology Transfer Office, Naval Surface Warfare Center Crane, email: Cran_CTO@navy.mil.

BACKGROUND AND SUMMARY OF THE INVENTION

The present invention relates to apparatuses and methods for implementing various physically PUFs and random number generator capabilities. In particular, some embodiments are directed to various physically PUFs and random number generator implementations including systems that utilize retention time cell characteristics of dynamic random access memory (DRAM) systems.

A PUF can include a physical entity that is embodied in a physical structure and is easy to evaluate but hard to predict. Further, some embodiments of an individual PUF device should be easy to make but practically impossible to duplicate, even given the exact manufacturing process that produced it. In this respect, some examples of a desired PUF can have a hardware analog of a one-way function. PUFs can be used in the microelectronics industry in applications such as tracking chips in the supply chain, performing on-chip authentication for the execution of functions, and various other means.

Random numbers are essential in a wide range of cryptographic applications. A "random" numbers can be created from a pseudo-random number generating algorithm. All pseudo-random algorithms have a significant vulnerability issue: if one knows the algorithm and initiation seed (e.g., a starting point data input) it might be possible to reproduce the sequence.

According to an illustrative embodiment of the present disclosure, methods and apparatuses for implementing a Physically Unclonable Function (PUF) and random number generator capabilities comprising providing a device under test comprising a plurality of bits comprising integrated circuits each including a capacitor; placing the bits in a first state with charge on selected bit capacitors; stopping bit refresh for a first predetermined time; re-enabling refresh for a second predetermined time to read and refresh charge on all bits; reading all bits and recording addresses of bits that have experienced bit flip from a first state to a second state comprising from "1" to "0" state; performing selecting a plurality of said recorded addresses to generate a PUF or cryptographic key; and performing an operation comprising a test or verification operation with said generated information PUF or key. Various hardware elements are also provided as well as machine readable instructions for implementing and controlling aspects of the invention.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which:

FIG. 4 shows exemplary retention time bit flips for varying times without refresh;

FIG. 5 shows exemplary multiple runs of bit flips for a same time without refresh (to extract an exemplary PUF response) where highlighted elements show bits that have retention time failures;

FIG. 10 shows a simplified representation of two modules of an exemplary software embodiment in accordance with one embodiment of the invention.

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Figure 1:
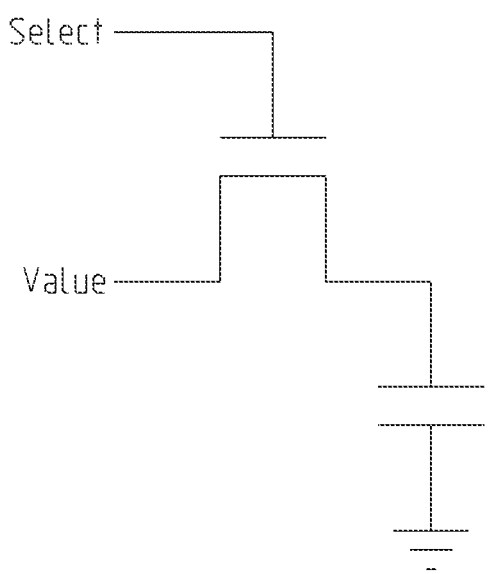
FIG. 1 shows an exemplary SDRAM bit cell schematic.

Embodiments of the invention can incorporate randomness of an exemplary semiconductor manufacturing process for a DRAM bit cell to generate a PUF and random number generator. As some background, a schematic for a typical DRAM bit cell is shown in FIG. 1 containing a transistor in series with a capacitor. For this example, the bit cell can be shown as reading a '1' when charge is stored on the capacitor and reading a '0' when the charge as been removed. Once the bit cell capacitor has been charged, it will slowly lose charge through leakage through the capacitor and transistor. The time required for a given DRAM cell to lose enough charge to read as a '0' is referred to as "retention time". A "retention time failure" is referred to a bit flipping from a '1' to a '0' when the time between refreshes is long enough to leak enough charge off the capacitor to read the cell as a '0'. A refresh time specification is generated by chip manufacturers to require that the capacitors are recharged periodically to avoid this loss of charge.

Figure 2:
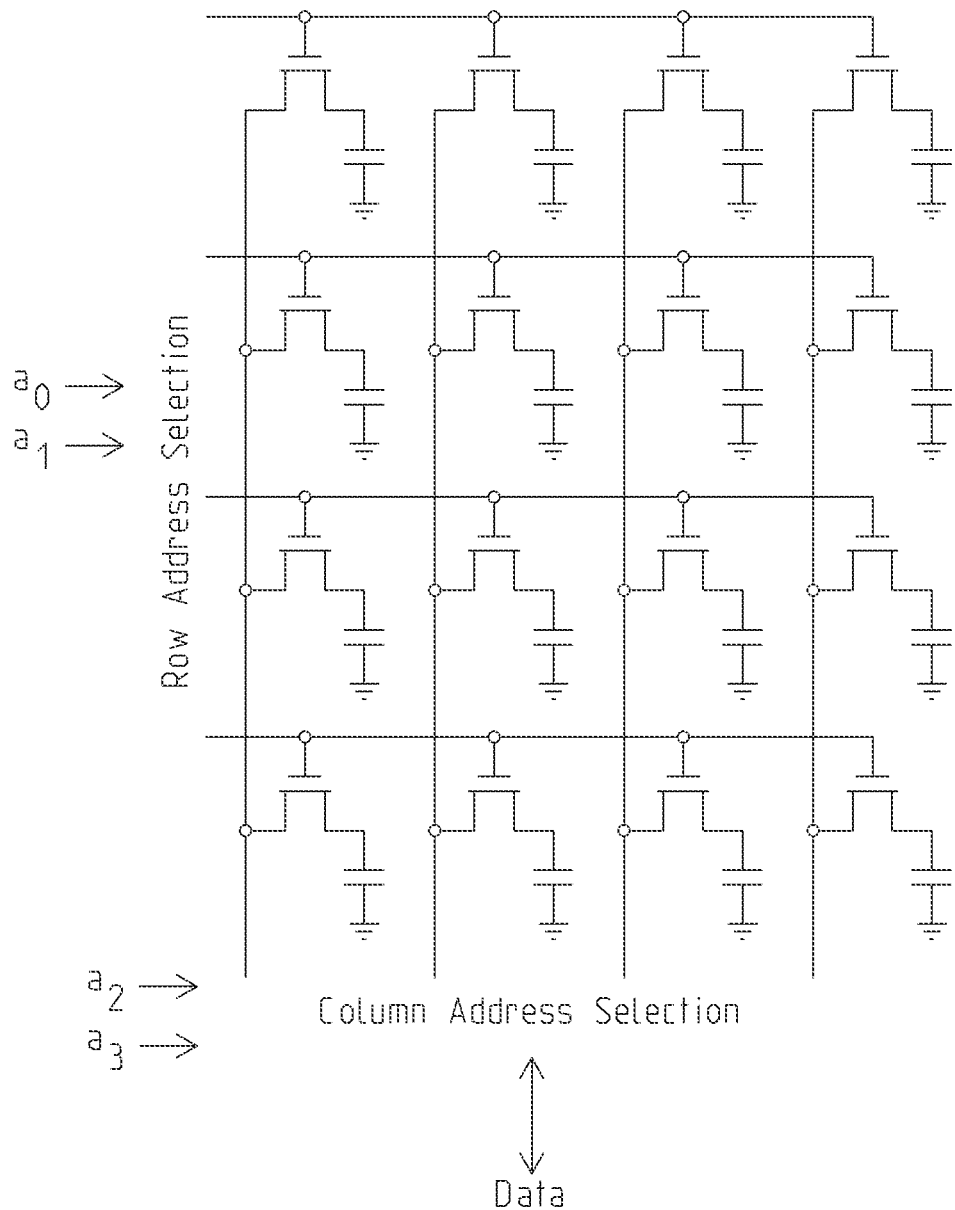
FIG. 2 shows an exemplary SDRAM array.

Large arrays of cells can be wired together as shown in FIG. 2 to create large density DRAM memories. Transistors are accessed via row and column lines to store charge on the capacitor of the appropriate bit line.

Figure 3:
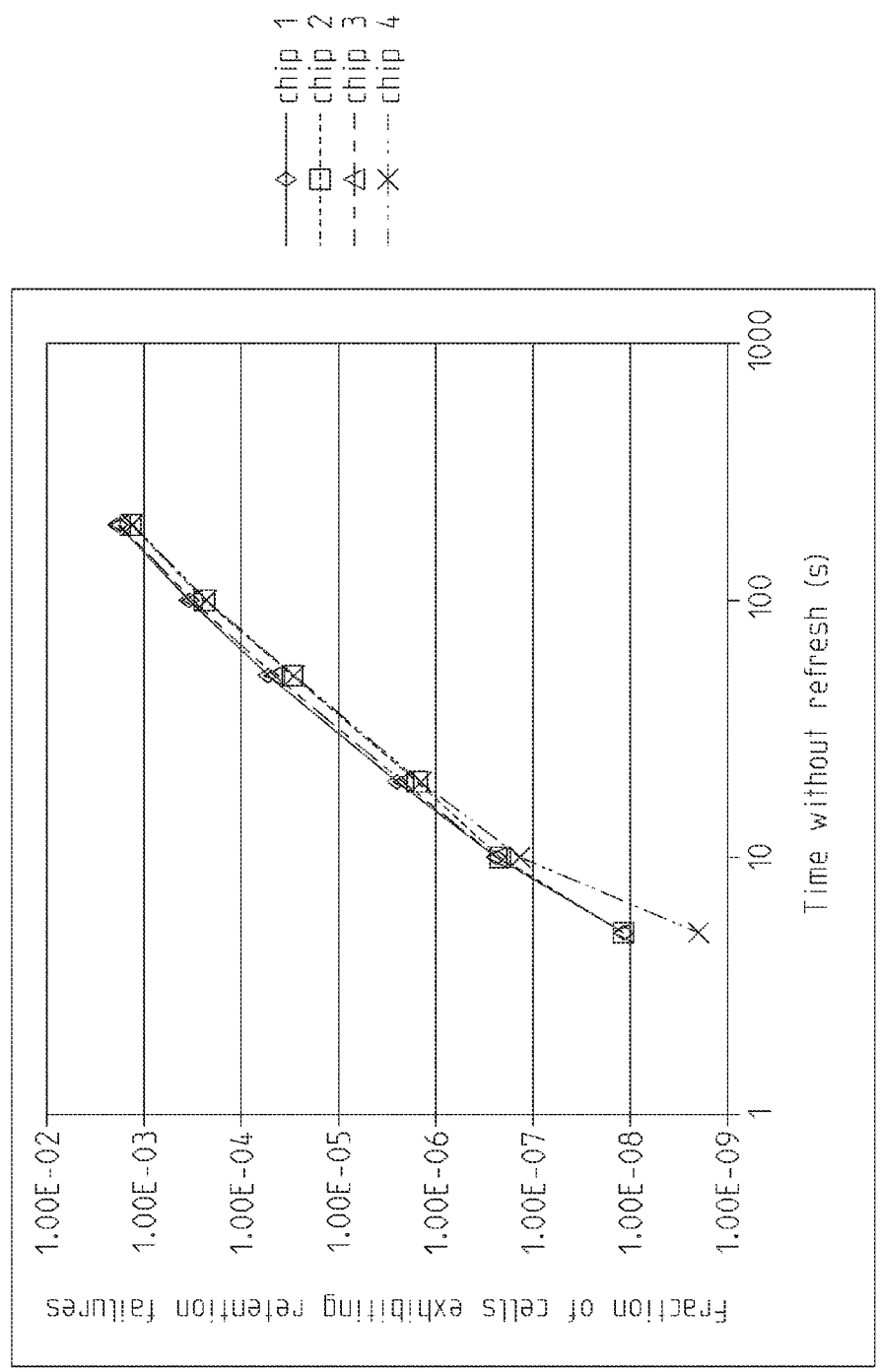
FIG. 3 shows exemplary retention time bit flips (SDRAM bit flips vs. time without refresh)

Random process defects during the semiconductor manufacturing process can cause variations in the retention times between cells in a given array. These variations in retention time cause a small but significant number of cells to exhibit retention time failures that occur within the manufacturers retention time specification, but occur early in the distribution of retention time failures within the array. A plot showing the percentage of bits on four samples that have flipped from a '1' to a '0' due to retention time failures is shown in FIG. 3. There are two important data items in this figure that are important to note.

First, specific addresses of cell bits that have retention time failures are repeatable within each chip, e.g., for chip A, at five seconds of time without a refresh the fraction 1E-8 (or in other words, 1 out of ten to the eight power or negative 0.000001 percent) of cells fails a bit flip is observed. Repeated measurements of this experiment can yield the same fraction for a particular cell or device element and same addresses of which the bit flips are observed.

Second, specific addresses of bits that have retention time failures are random between different chips, e.g., chip A and chip B at five seconds of time without a refresh both yield the same or close to the same failure percentage or value e.g., a fraction 1E-8 of bit flips BUT the addresses where the bit flips occur are different between each chip. In other words, use of the same manufacturing process across or line to manufacture different devices produced on the same process or line, then chip A and chip B show a percentage of bits failing in each chip will be about the same but actual positions of failure cells will be different between chip A versus chip B.

Specific addresses of bits that have retention time failures can be used to construct random numbers and PUFs. FIG. 4 shows an example of data from an array of one column and eight rows. For this example, an address is represented by a row/column combination in FIG. 2. The value of the bits at t=To is for all of the bits to store a '1'. It can be seen that while all bits start at '1', they eventually transition to '0'. If we stop the experiment at t=T1, then we can see that from addresses [ADDR0:ADDR7] we have "10110110" and if we stop the experiment at t=T2 we have "10010110"

PUF Design. Specific addresses of cell bits that have retention time failures can be used to construct a PUF in accordance with one embodiment of the invention. FIG. 4 shows an example of data from an array of one column and eight rows. For this example, an address is represented by a row/column combination such as in FIG. 2. A value of the bits at $t=T_o$ is for all of the bits to store a '1'. It can be seen that while all bits start at '1', they eventually transition to '0'. If the experiment is halted at $t=T_1$, then data at addresses [ADDR0:ADDR3] can be represented as "1011" and data at addresses [ADDR4:ADDR7] can be represented as "0110". In this example, an exemplary design can include creating a challenge and response pair associated with an exemplary PUF design where a challenge can be an address range and a response can be some representation of bits that have flipped due to retention time failures. For example, challenge1=[ADDR0:ADDR3] with response1="1011" and challenge2=[ADDR4:ADDR7] with response1="0110". A length of the address space per challenge could be lengthened as needed for the application. So, for example, if a desired application or requirement (e.g., anti-counterfeiting verification or supply chain integrity evaluation) calls for 256 bits, then a designer can select ADDR0:ADDR255 to produce a 256 bit PUF response.

PUF Response Extraction. A designer can extract an N-bit PUF response from retention time measurements in several different ways. One of the simplest ways for PUF response extraction is to simply extract a data pattern in first N addresses by stopping the refresh for a given time T. One drawback of this approach can include noise in the measurement around T or environmental issues (e.g., temperature). Noise can be reduced by stopping the measurement at a time T1, recording the result and then repeating the experiment several times and averaging the results. Another approach is to repeat testing and identify results that are the closest to each other e.g., fifty tests that generate results that have minimal differences.

Another way to extract a response with increased usefulness (randomness from chip to chip) is put charge on selected bits to store a predetermined value, e.g., "1", then stop the refresh, observe retention time failures from selected bits (over time some bits lose their charge and flip to reading a "0") and perform a mathematical operation on the addresses exhibiting the failures (e.g., "0" readings) then, for example, calculating a result of the failing address mod 2 (e.g., divide by two and take remainder and use the remainder value). The exemplary random failing addresses will then produce a mod 2 result that can be saved as the N-bit response. In other words, for example, where ten addresses produce retention failure bit flips, then an exemplary system can use a finding of whether the ten addresses were even or odd based on the mod 2 result to identify an actual value that can be used for transforming bit response into a value that can be stored and used for calculations.

FIG. 5 shows an example with averaging to reduce noise of stopping the refresh for time $T_1$ and recording addresses with bit flips. In this example, addresses one, four and seven had bit flips corresponding to a pattern or response of "010". The length of the address space could be lengthened as needed for the application. Flow charts discussing various embodiments of such exemplary processing can be found in FIGS. 6-8.

Random Number Generator. DRAMs can contain a small percentage of cells that exhibit variable retention time (VRT) which can be exploited to produce a random number generator. These cells can have a retention time that randomly varies with time due to the absence or presence of a trap in the oxide of the transistor in FIG. 1. Statistics obtained from these cells can be used to determine the percentage of time spent in each different retention time state. A bin of retention time states can obtained from the statistical analysis to determine a certain retention time window to represent a '0' and a complementary retention time window to represent a '1'. Once this is determined, multiple retention time measurements can be performed on the cell to generate a random pattern of '0's and '1's. Since the presence of trap sites is believed to be the cause of VRT behavior, irradiating cells with ionizing radiation may be a method to increase the VRT sensitivity and increase the number of these traps if desired.

Figure 6:
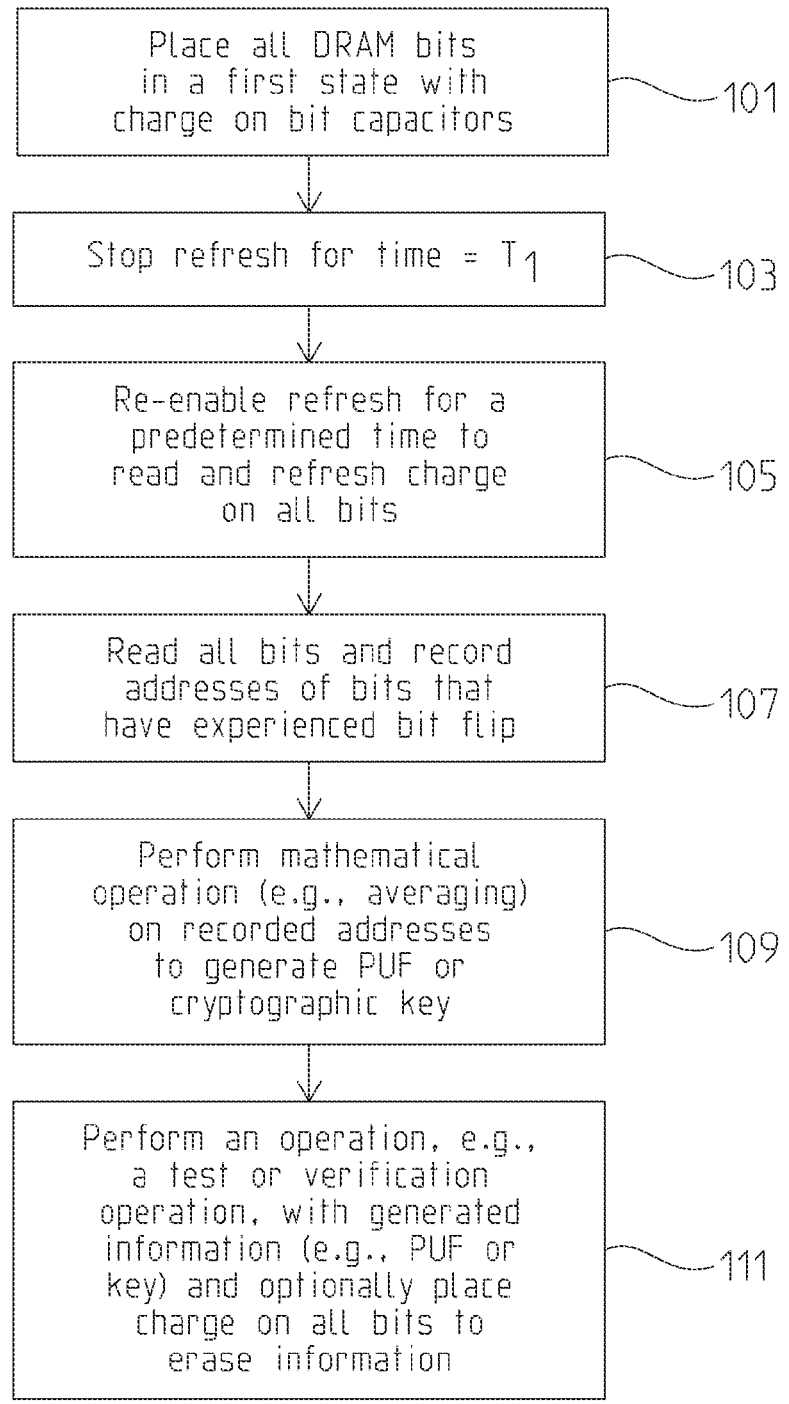
FIG. 6 shows an exemplary simplified method for extracting PUF response data.

Referring to FIG. 6, one exemplary simplified method for extracting a PUF response is shown. At step 101, provide a device under test, e.g., a DRAM, and place all DRAM bits in a first state with charge on selected DRAM bit capacitors. At step 103, stop DRAM bit refresh for time=$T_1$. At step 105, re-enable refresh for a predetermined time to read and refresh charge on all bits (can include refreshing existing charge at time of execution of step 105). At step 107, read all bits and record addresses of bits that have experienced bit flip from first state to a second state (e.g. from "1" to "0" state). At step 109, perform mathematical operation (e.g., averaging) on recorded addresses to generate PUF or cryptographic key. At step 111, perform an operation, e.g., a test or verification operation, with generated information (e.g., PUF or key) and optionally place charge on all bits to erase information.

Figure 7:
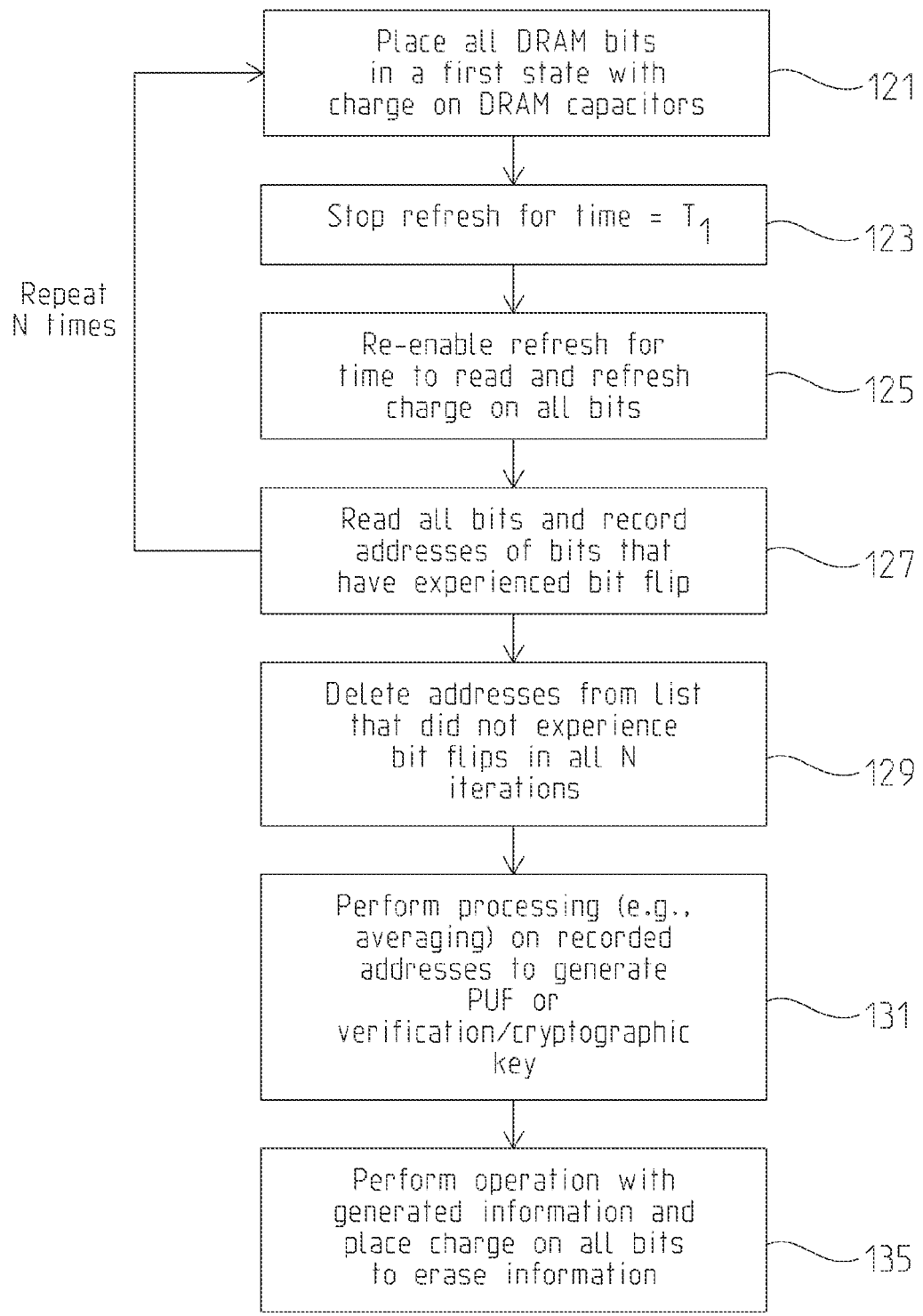
FIG. 7 shows an alternative method for extracting PUF response.

Referring to FIG. 7, an alternative method for extracting a PUF response is shown. At step 121, provide a device under test, e.g., a DRAM, and place all DRAM bits in a first state with charge on DRAM capacitors. At step 123, stop DRAM refresh for time=$T_1$. At step 125, re-enable refresh for time to read and refresh charge on all bits. At step 127, read all bits and record addresses of bits that have experienced bit flip. Repeat steps 121 through 127 N times (N can be determined based on desired number of bits used in desired PUF response extraction result). At step 129, delete addresses from recorded list that did not experience bit flips in all N iterations. At step 131, perform processing (e.g., averaging) on recorded addresses to generate PUF or verification/cryptographic key data. At step 135, perform one or more operations, e.g., verification operation, storing operation, random number based operation, with generated information and place charge on all bits to erase information.

Figure 8:
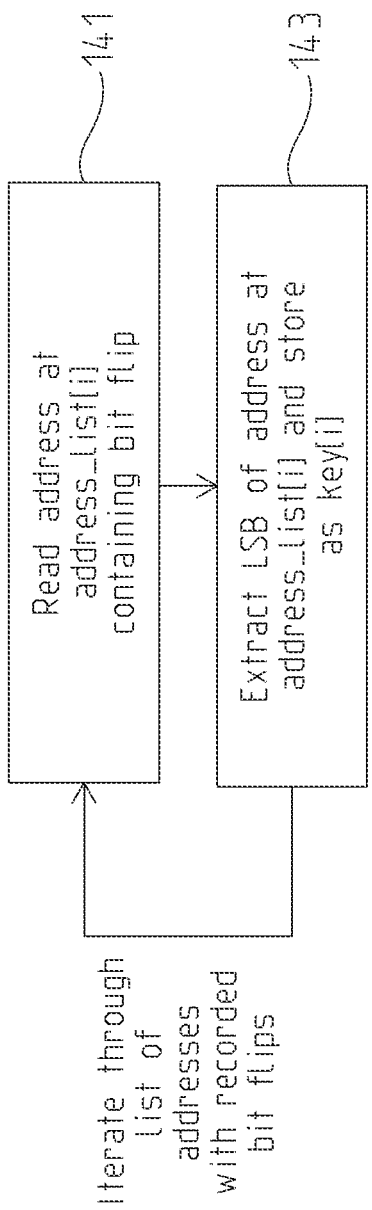
FIG. 8 shows one exemplary implementation of step 6 in FIG. 7.

Referring to FIG. 8, one exemplary implementation of FIG. 7 step 6 is shown. At step 141, read addresses at address_list[i] containing bit flips previously recorded. At step 143, extract least significant bit (LSB) of addresses at address_list [i] and store as key[i]. Repeat steps 141 and 143 through list of addresses with recorded bit flips.

Figure 9:
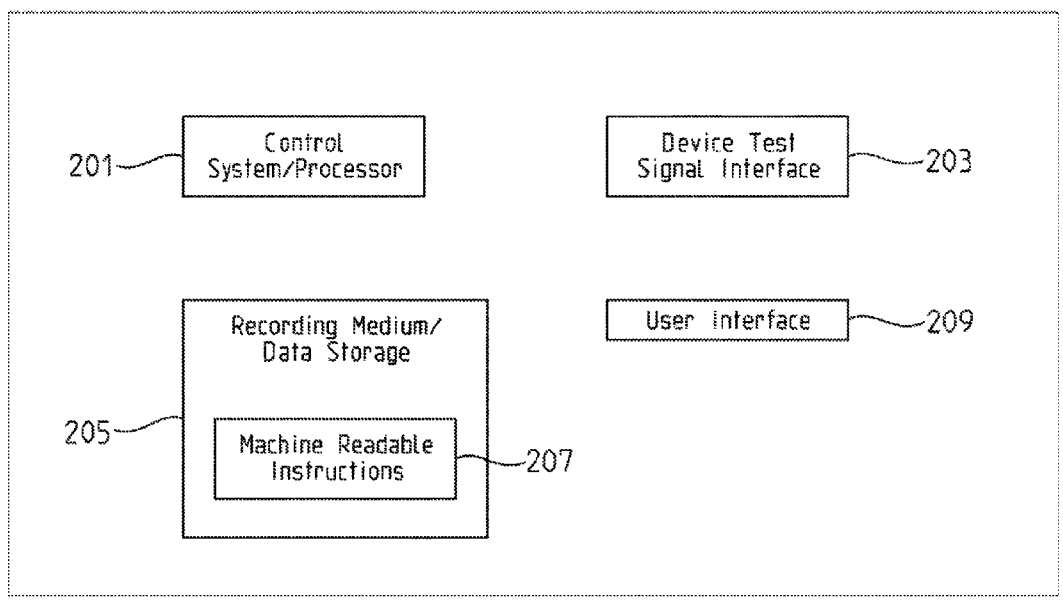
FIG. 9 shows a simplified hardware/software architecture in accordance with one embodiment of the invention.

Referring to FIG. 9, a simplified hardware and software architecture is shown for one exemplary embodiment of the invention. A control system 201, device test signal interface 203, recording medium/data storage section 205, machine readable instructions 207 containing machine readable instructions implementing embodiments of the invention and adapted for controlling the control system/processor 201, device test signal interface 203, and user interface 209 is shown. Machine readable instructions 207 include instructions adapted to control elements of the invention to include instructions implementing FIGS. 6-8.

Referring to FIG. 10, a simplified representation of some software elements in accordance with one embodiment of the invention. Modules include a PUF Response Data Extraction/Key Creation/Storage Module 301 and a PUF Response Verification Module 3-3 are provided. PUF Response Data Extraction/Key Creation/Storage Module 301 includes instructions configured to control various elements of an embodiment of the invention to include: Position device under test (e.g., DRAM); Couple the device with test control station; Execute machine readable instructions (e.g., some or all of FIGS. 6-8 steps) to generate stored PUF response key data; and Record PUF response key data. Exemplary PUF Response Verification Module 303 includes instructions configured to control various elements of an embodiment of the invention to include: Position device under test; Couple device under test with test control station; Execute machine readable instructions (e.g., some or all of FIGS. 6-8 steps) to generate test PUF response key data; Compare stored PUF response key data with test PUF response data from the device; Determine a match or no match where Match=verified and No match=not verified; and Display or output match or no-match result Although the invention has been described in detail with reference to certain preferred embodiments, variations and modifications exist within the spirit and scope of the invention as described and defined in the following claims.

The invention claimed is:

1. A method for implementing or manufacturing and using a Physically Unclonable Function (PUF) and random number generator capability comprising
   providing a first device under test comprising a plurality of bits comprising integrated circuits each including a capacitor;
   providing a device signal interface system configured to interface with a first device under test and perform control and measurement functions on said first device under test;
   placing the bits in a first state with charge on selected said bit capacitors;
   stopping bit refresh for a first predetermined time;
   re-enabling refresh for a second predetermined time to read and refresh charge on all bits;
   reading all said bits and recording a plurality of first addresses of said bits that have experienced bit flip from a first state to a second state comprising from "1" to "0" state;
   selecting a plurality of said plurality of first recorded addresses to generate a PUF or a cryptographic key data and storing said PUF or said cryptographic key data in a first data structure on a data recording medium; and
   performing an operation comprising a test or verification operation with said PUF or said cryptographic key data on a second device under test produced from a same manufacturing facility as the first device under test, wherein said test or verification operation further comprises comparing said PUF or said cryptographic key data with a plurality of second addresses of said second device under test's bits corresponding to addresses of said first recorded addresses in said first device under test to determine if said second recorded addresses in said second device under test have a first bit flip total number within a first range of said PUF or said cryptographic key data's bit flip total number and outputting said comparison result to said another recording medium or an operator's display.

2. A method as in claim 1, wherein said PUF or cryptographic key data further comprises a first percentage of said first device under test bits exhibiting said bit flip in said first device under test versus first device under test total bits, said operation further comprises computing a second percentage of said bits exhibiting said bit flip in said second device under test versus total bits of said second device under test and determining if said second percentage is within said range of said first percentage.

3. A method as in claim 1, wherein said first and second device under test is a DRAM.

4. A method as in claim 1, wherein said first and second predetermined time is stored in said first data structure on said data recording medium.

5. A method as in claim 1, wherein said test or verification operation further comprises:
   placing the second device under test's bits in a first state with charge on selected said second device under test's bit capacitors;
   stopping said second device under test's bit refresh for said first predetermined time;
   re-enabling refresh for said second predetermined time to read and refresh charge on all said second device under test's bits;
   reading all said second device under test's bits and a plurality of second recording addresses of said second device under test's bits that have experienced bit flip from said first state to said second state comprising from said "1" to "0" state;

selecting a plurality of said second device under test's said plurality of second recorded addresses to generate a second PUF or a cryptographic key data and storing said second PUF or said cryptographic key data in a second data structure on another data recording medium.

6. A system for implementing a PUF or random number generator capability comprising:
   a first section comprising
      a control system,
      a device test signal interface configured to interface with a first device under test, said first device under test comprising a plurality of bits comprising integrated circuits each including a capacitor;
      a user input/output interface system comprising an input system and a display;
      a recording medium and data storage section comprising a plurality of non-transitory machine readable instructions adapted for interacting with said user input/output interface system and controlling a plurality of equipment items comprising the control system/processor, device test signal interface, and controlling said device test signal interface interactions with said first device under test;
   wherein said plurality of non-transitory machine readable instructions comprise:
      a first plurality of non-transitory machine readable instructions configured for controlling said another equipment items to place the first device under test's bits in a first state with charge on selected bit capacitors;
      a second plurality of non-transitory machine readable instructions configured for controlling said another equipment items to stop bit refresh for a first predetermined time;
      a third plurality of non-transitory machine readable instructions configured for controlling said another equipment items to re-enable refresh for a second predetermined time to read and refresh charge on all bits;
      a fourth plurality of non-transitory machine readable instructions configured for controlling said another equipment items to read all bits and recording addresses of bits that have experienced bit flip from a first state to a second state comprising from "1" to "0" state;
      a fifth plurality of non-transitory machine readable instructions configured for controlling said another equipment items to perform selection of a plurality of said recorded addresses to generate and save a PUF or cryptographic key data;
      a sixth plurality of non-transitory machine readable instructions configured for controlling said another equipment items comprising computing a first percentage of said bits exhibiting said bit flip in said first device under test and saving said first percentage as a part of said PUF or cryptographic key data; and
      a seventh plurality of non-transitory machine readable instructions configured to generate a user interface on said display to enable a user to control said equipment items and said apparatus.

7. A system as in claim 6, further comprising:
   a second section comprising
      another control system;
      another device test signal interface configured to interface with said second device under test, said second device under test comprising a plurality of bits comprising integrated circuits each including a capacitor, wherein said second device under test was manufactured from a same manufacturing process or line as was used for making said first device under test;
      another user input/output interface system comprising an input system and a display;
      another recording medium and data storage section comprising another plurality of non-transitory machine readable instructions adapted for interacting with said user input/output interface system and controlling another plurality of equipment items comprising the another said control system/processor, said another device test signal interface, and controlling said another device test signal interface interactions with said second device under test;
   wherein said another plurality of non-transitory machine readable instructions comprise:
      an eighth plurality of non-transitory machine readable instructions configured for controlling said another plurality of equipment items and place the second device under test's bits in said first state with charge on selected bit capacitors;
      a ninth plurality of non-transitory machine readable instructions configured for controlling said another equipment items for stopping bit refresh of said second device under test for said first predetermined time;
      a tenth plurality of non-transitory machine readable instructions configured for controlling said another equipment items for re-enabling refresh for a second predetermined time to read and refresh charge on all bits;
      an eleventh plurality of non-transitory machine readable instructions configured for controlling said another equipment items for reading all bits and recording addresses of bits that have experienced bit flip from a first state to a second state comprising from "1" to "0" state;
      a twelfth plurality of non-transitory machine readable instructions configured for controlling said another equipment items for performing selecting a plurality of said recorded addresses to generate a comparison PUF or cryptographic key;
      a thirteenth plurality of non-transitory machine readable instructions configured for controlling said another equipment items for performing an operation comprising a test or verification operation on a second device under test with said PUF or said cryptographic key data, said operation comprising computing a second percentage of said bits exhibiting said bit flip in said second device under test and determining if said second percentage is within a predetermined range of said first percentage; and
      a fourteenth plurality of non-transitory machine readable instructions configured for controlling said another equipment items to generate a user interface on said display to enable a user to control said equipment items and said apparatus.

8. A system as in claim 6, wherein said first and second device under test is a DRAM.

9. A system for implementing or manufacturing and using a Physically Unclonable Function (PUF) or random number generator capability comprising:
- a control system and a device test signal interface configured to interface with a first device under test, said first device under test comprising a plurality of bits comprising integrated circuits each including a capacitor;
- a user input/output interface system comprising an input system and a display;
- a recording medium and data storage section comprising a plurality of non-transitory machine readable instructions adapted for interacting with said user input/output interface system and controlling a plurality of equipment items comprising the control system/processor, device test signal interface, and controlling said device test signal interface interactions with said first device under test, wherein said plurality of non-transitory machine readable instructions comprise:
- a first plurality of non-transitory machine readable instructions configured for controlling said plurality of equipment items to place the first device under test's bits in a first state with charge on selected said bit capacitors;
- a second plurality of non-transitory machine readable instructions configured for controlling said plurality of equipment items to stop said first device under test's bit refresh for a first predetermined time;
- a third plurality of non-transitory machine readable instructions configured for controlling said plurality of equipment items to re-enable said first device under test's bit refresh for a second predetermined time to read and refresh charge on all said first device under test's bits;
- a fourth plurality of non-transitory machine readable instructions configured for controlling said plurality of equipment to read all said first device under test' bits and recording a plurality of first addresses of said first device under test's bits that have experienced bit flip from a first state to a second state comprising from "1" to "0" state;
- a fifth plurality of non-transitory machine readable instructions configured for controlling said plurality of equipment to select a plurality of said plurality of first recorded addresses to generate a first PUF or a cryptographic key data and storing said first PUF or said cryptographic key data in a first data structure on a data recording medium; and
- performing an operation comprising a test or verification operation with generated said first PUF or said cryptographic key data on a second device under test produced from a same manufacturing facility as the first device under test using said first PUF or said cryptographic key data, wherein said test or verification operation further comprising controlling said equipment to place the second device under test's bits in said first state with charge on selected said second device under test bit capacitors, stop said second device under test's bit refresh for said first predetermined time, re-enabling said second device under test's bit refresh for said second predetermined time to read and refresh charge on all said second device under test's bits, reading all said second device under test' bits and recording a plurality of second addresses of said second device under test's bits that have experienced bit flip from said first state to said second state comprising from "1" to "0" state, selecting a plurality of said plurality of second recorded addresses to generate a second PUF or a cryptographic key data, and computing a second percentage of said bits exhibiting said bit flip in said second device under test and determining if said second percentage is within a predetermined range of said first percentage, outputting a result data indicating if said second percentage was within the said predetermined range of said first percentage to an operator or a data file.

10. A system as in claim 8, wherein said first and second devices under test are DRAMs.

11. A system as in claim 8, wherein said first and second predetermined time is stored in said first data structure on said data recording medium.

* * * * *